United States Patent [19]

Miller

[11] Patent Number: 5,001,483
[45] Date of Patent: Mar. 19, 1991

[54] DIGITAL TO ANALOG CONVERTER FOR AN ACOUSTIC CHARGE TRANSPORT DEVICE

[75] Inventor: Robert L. Miller, Bowie, Md.

[73] Assignee: Westinghouse Electric Corp., Pittsburgh, Pa.

[21] Appl. No.: 425,893

[22] Filed: Oct. 23, 1989

[51] Int. Cl.$^5$ ............................................ H03M 1/66
[52] U.S. Cl. .................... 341/144; 333/196; 330/5
[58] Field of Search ................ 341/133, 137, 144; 357/24, 25, 26; 310/311, 313 R, 322, 320; 333/193, 196; 330/5

[56] References Cited

U.S. PATENT DOCUMENTS

| | | |
|---|---|---|
| 3,656,862 | 4/1972 | Rahaim et al. . |
| 4,416,457 | 11/1983 | McGinnis et al. . |
| 4,633,285 | 12/1986 | Hunsinger et al. . |
| 4,742,333 | 5/1988 | Willhite ............................ 341/159 |
| 4,839,607 | 6/1989 | Schink ............................. 330/5.5 |
| 4,876,546 | 10/1989 | Koerner .......................... 342/15 |
| 4,884,001 | 11/1989 | Sacks et al. ..................... 357/26 X |
| 4,893,161 | 1/1990 | Tanski et al. ................... 357/24 |
| 4,926,146 | 5/1990 | Yen et al. ........................ 333/195 |

OTHER PUBLICATIONS

"Quadrature Mirror Filter Design for an Arbitrary Number of Equal Bandwidth Channels", IEEE Trans. Acoust., Speech and Signal Processing, vol. ASSP-33, No. 1, pp. 203-218 (Feb. 1985).

Zenith Spectrum Compatible HDTV System, Sep. 1, 1988.

R. J. Kansy, "Acoustic Charge Transport Signal Processors", pp. 141-152, Urbana, Ill.

Primary Examiner—A. D. Pellinen
Assistant Examiner—Brian K. Young
Attorney, Agent, or Firm—W. G. Sutcliff

[57] ABSTRACT

A digital-to-analog converter for an acoustic charge transport (ACT) device that permits an ACT device to directly accept digital inputs. The digital-to-analog converter includes a plurality of digital-to-analog converter circuits that convert respective groups of digital information applied to the ACT device to corresponding analog voltages. The corresponding analog voltages are applied to respective input contacts that are isolated by charge barriers formed in a channel region of the ACT device. Each of the input contacts generates a charge packet having a charge magnitude corresponding to a numerical value of an input group of the applied digital information. The charge packets generated by each of the input contacts coalesces into a collective charge packet which then travels through the ACT device.

12 Claims, 2 Drawing Sheets

DIGITAL TO ANALOG CONVERTER FOR AN ACOUSTIC CHARGE TRANSPORT DEVICE

BACKGROUND OF THE INVENTION

The present invention relates to an acoustic charge transport (ACT) device; and more particularly, to a digital input structure for an ACT.

The simple structure of an ACT device together with its high charge transport efficiency and self clocking of charges through the device make an ACT device ideally suited for many filtering applications. Because of the popularity of digital signalling processing, in many applications ACT filters must interface with digital signal processing circuits. In such applications, analog-to-digital converters, and digital-to-analog converters are generally required. As with all electronic systems, it is usually desirable to reduce the number of components needed to implement a given signal processing application. There is therefore a need in the industry for an ACT device that directly accepts digital inputs, without the need for a separate digital-to-analog converter.

Recently proposed digital high definition television (HDTV) systems provide an example of systems that can use ACT devices that are capable of directly accepting digital data. It is estimated that such digital HDTV systems will require some 14.4 billion operations per second. To reduce this processing burden, I have proposed, in my co-pending U.S. patent application Ser. No. 07/425,892 entitled "A HIGH DEFINITION TELEVISION/ACOUSTIC CHARGE TRANSPORT FILTER BANK" and that is assigned to the same assignee as this application, using ACT devices to eliminate approximately two-thirds of this processing. But, digital-to-analog converters are needed to interface the ACT devices with the digital signal processing circuitry. Thus, it is desirable to have ACT devices that can be used in HDTV systems such as the recently proposed digital HDTV systems, and that can directly accept digital input data without additional peripheral interface circuits.

SUMMARY OF THE INVENTION

It is an object of the present invention to provide a structure that permits an ACT device to directly receive digital information.

It is another object of the present invention to provide a digital-to-analog converter incorporating an ACT device.

It is a further object of the present invention to provide a digital-to-analog converter for an ACT device having a non-linear relationship between input digital information and the resulting analog voltage.

It is still a further object of the present invention to provide a digital-to-analog converter for an ACT device that can be used in digital HDTV systems to directly accept digital input data.

To achieve the above and other objects, the present invention provides a digital-to-analog converter for an acoustic charge transport (ACT) device having a channel region, comprising: receiving means for receiving N bits of digital information; and ACT packet means for generating a plurality of charge packets in the channel region, each of the charge packets having a charge corresponding to a respective group of the N bits of digital information.

The present invention also provides a method of converting N bits of digital information for an acoustic charge transport device to an analog voltage comprising the steps of: (a) converting groups of the N bits of digital information to corresponding analog voltages; (b) generating charge packets in the acoustic charge transport device so that the charge packets have a charge corresponding to respective ones of the analog voltages; and (c) confining the charge packets to specified areas of the acoustic charge transport device.

DESCRIPTION OF THE PREFERRED EMBODIMENT

Figure 1:
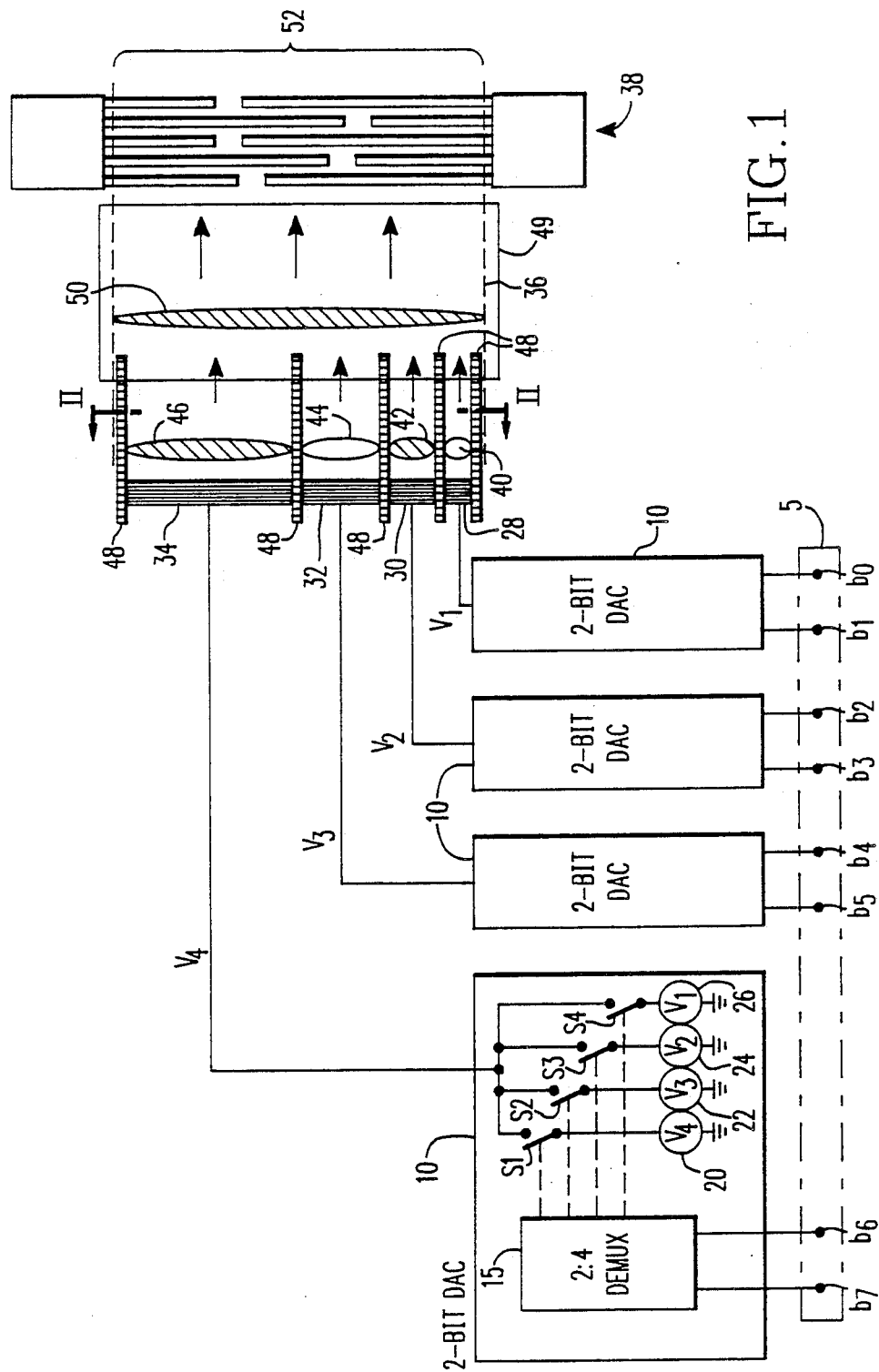
FIG. 1 is a schematic diagram of a preferred embodiment of the present invention.

FIG. 1 is a schematic block diagram of a preferred embodiment of the present invention. In FIG. 1, reference numeral 5 identifies input terminals. The terminals 5 receive N bits of digital information. As shown in FIG. 1, the input terminals 5 receive eight (N=8) bits of digital information ($b_0$, $b_1$, $b_2$, $b_3$, $b_4$, $b_5$, $b_6$, $b_7$) wherein the digital information is arranged in four groups of two bits each. The input terminals 5 function as a receiving means for receiving N (e.g., 8) bits of digital information.

Each group of digital information (e.g., $b_1$ $b_0$) is converted into a corresponding analog voltage by a digital-to-analog converter 10 as shown in FIG. 1, each digital-to-analog converter 10 receives a group of two bits of the digital information. Those skilled in the art will recognize that the digital-to-analog converters can convert any number of the input bits to a corresponding analog voltage.

As shown in FIG. 1, one embodiment of the analog-to-digital converters 10 include a two-input, four-output demultiplexer 15, a set of voltage sources 20, 22, 24 and 26, and a set of switches S1, S2, S3 and S4 respectively controlled by the four outputs of the demultiplexer 15. In the embodiment shown in FIG. 1, each group of the N bits of digital information is converted into a corresponding analog voltage.

The respective outputs of the digital-to-analog converters 10 are applied to input contacts 28, 30, 32 and 34. The input contacts are positioned adjacent to a channel region 36 of an ACT device 38. The general structure of an ACT device is known and discussed in, for example, U.S. Pat. No. 4,633,285 to Hunsinger et al., which is hereby incorporated by reference.

Each of the input contacts (28, 30, 32, 34) generates a corresponding charge packet (40, 42, 44, 46) in the ACT device channel region 36. Each of the charge packets (40, 42, 44, 46) has a charge with a magnitude corresponding to the analog voltage applied to the respective input contacts (28, 30, 32, 34). As shown in FIG. 1, the input contacts (28, 30, 32, 34) have at least one dimension (e.g., length) that corresponds to the numerical (e.g., binary) significance of the corresponding group of input digital information. For example, input contact 28 has a length that corresponds to the least significant bits $b_0$, $b_1$. The input contact 30 receives an analog input voltage having a magnitude corresponding to a second group ($b_3$ $b_2$) of the digital information. This input contact 30 has a length that is twice that of the input contact 28. Similarly, input contact 32 receives an analog input voltage corresponding to a third group ($b_4$ $b_5$)

of the input information. The input contact 32 therefore has a length that is four times that of input contact 28. In accordance with the above binary weighing of the length of the input contacts 28, 30 and 32, input contact 34 has a length that is approximately eight times that of input contact 28. Other weighing schemes can be used as desired. The respective charge packets (40, 42, 44, 46) are confined to specified areas of the channel region 36 by charge barriers 48 as shown in FIG. 1. Because of the weighted size of the input contacts, the individual charge packets (40, 42, 44, 46) have an amount of charge that correspond to a numerical significance of a respective group of the N bits of digital information applied to the input terminals 5.

As shown in FIG. 1, after the individual charge packets (40, 42, 44, 46) leave the specified areas of the channel region 36, they coalesce into a collective charge packet 50. As is well known, such a charge packet 50 is transported in the channel region 36 by acoustic waves applied to the ACT device 38 towards and under an array of non-destructive sensors 52. The magnitude of charge in the collective charge packet 50 is proportional to the numerical value of the digital information applied to the input terminals 5. Together, the digital-to-analog converters 10, input contacts (28, 30, 32, 34) and charge barriers 48 comprise an ACT packet means for generating a plurality of charge packets (40, 42, 44, 46) in the channel region 36. Each of the charge packets (40, 42, 44, 46) has a charge that corresponds to a respective group of the digital information applied to the input terminals 5. Within this ACT packet means, the analog-to-digital converter 10 functions as a converting means that converts groups of the digital information ($b_7$, $b_6$, $b_5$, $b_4$, $b_3$, $b_2$, $b_1$, $b_0$) to analog voltages that are respectively applied to the input contacts (34, 32, 30, 28) and that have magnitudes corresponding to the groups of digital information applied to the input terminals 5.

As will be recognized by those skilled in the art, the ACT input structure shown in FIG. 1 is schematic in nature. In addition to the input contacts (28, 30, 32, 34), the input structure includes a channel plate 49. The channel plate 49 comprises a rectifying contact such as Schottky metal barrier, or a p-type semiconductor. When operating the structure shown in FIG. 1, there is a potential difference between the channel plate 49 and the input contacts (28, 30, 32, 34) that determines the amount of charge that is injected into the channel region 36 in addition to the voltages applied to the input contacts. The channel plate 49 also confines the charges in a vertical direction within the ACT device.

The voltages generated by the voltage sources (20, 22, 24, 26) can be set so that the analog voltages applied to the input contacts (28, 30, 32, 34) have a non-linear relationship with the corresponding group of digital input information. For example, the analog voltage applied to input contact 34 can have a non-linear relationship with the bit group $b_7$ $b_6$ of the digital information applied to the input terminals 5. This non-linear relationship can help compensate for the inherent non-linearity in the formation of charge packets 40, 42, 44 and 46 in the channel region 36 of the ACT device 38. By using a non-linear relationship between voltage generated based on the bit group, charge packets in an ACT device embodying the present invention will have a substantially linear relationship with the bit group. Specifically, if we denote Q(Vi) as the charge injected into a packet at one of the input contacts (28, 30, 32 or 34) by voltage Vi, where i = 1, 2, 3 or 4 in the embodiment shown in FIG. 1, then the voltages are chosen to assure that:

$$Q(V2) = 2*Q(V1)$$
$$Q(V3) = 3*Q(V1),$$
$$Q(V4) = 4*Q(V1).$$

Each digital to analog converter 10 shown in FIG. 1 contains voltage sources similar to 20, 22, 24 and 26. The voltages produced by the corresponding voltage sources may, in general, be different in the different converters 10, to provide an additional degree of freedom. This could be useful, for example, to provide extra adjustment capability to compensate for small differences between the input contacts (28, 30, 32, 34) in order to assure an overall linear relationship between the digital information ($b_7$, $b_6$, $b_5$, $b_4$, $b_3$, $b_2$, $b_1$, $b_0$) and the charge in the coalesced packet 50.

Figure 2:
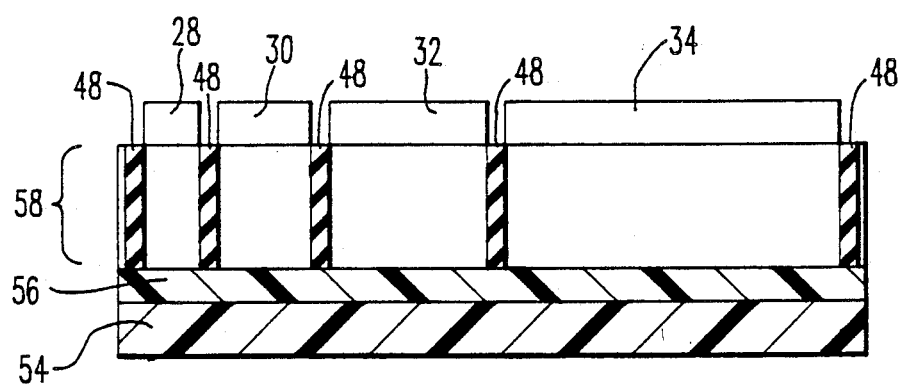
FIG. 2 is a schematic, cross-sectional diagram of a portion of the FIG. 2 system.

FIG. 2 is a cross-sectional view of a portion of the ACT device shown in FIG. 1. In FIG. 2, structural features that are the same or substantially similar to those shown in FIG. 1 have the same reference numerals as used in FIG. 1. In FIG. 2, reference numeral 54 identifies a semi-insulating substrate such as gallium arsenide, which has a layer 56 formed thereon. The layer 56 can comprise, for example, p doped GaAs. A layer 58 can comprise a piezoelectric semiconductor material such as GaAs. The layer 58 functions as the channel region shown in FIG. 1. The charge barriers 48 shown in FIG. 2 comprise regions of the layer 58 that have been damaged by proton bombardment. Proton bombardment is a well known technique for limiting the conductivity of an otherwise semiconductive layer. Because of the proton bombardment, the crystal structure in regions 48 is severely damaged, and charges tend not to flow into such regions. Consequently, the regions 48 function as isolation regions that electrically isolate specified areas of the channel region 36.

It is not intended to limit the present invention to the embodiments described, instead the scope of the present invention is defined by the following claims.

We claim:

1. A digital-to-analog converter for the input of an acoustic charge transport (ACT) device having a channel region, comprising:

receiving means for receiving N bits of digital information from a digital input source; and ACT packet means for generating charge packets in the channel region, each of said charge packets having a charge corresponding to a respective group of said N bits of digital input information.

2. A digital-to-analog converter for the input of an acoustic charge transport device according to claim 1, wherein said ACT packet means comprises:

input contact means, positioned adjacent to the channel region, for generating said charge packets in accordance with respective input voltages; and barrier means for confining said charge packets to specified areas of the channel region.

3. A digital-to-analog converter for an acoustic charge transport device according to claim 2, wherein said ACT packet means further comprises:

converting means, operatively connected between said receiving means and said input contact means, for converting groups of said N bits of digital information to said input voltages, so that said input voltages have respective magnitudes corresponding to said groups of said N bits of digital information.

4. A digital-to-analog converter for an acoustic charge transport device according to claim 3, wherein said converting means includes means for generating said input voltages so that said magnitudes have a non-linear relationship with said corresponding group of N bits of digital information.

5. A digital-to-analog converter for an acoustic charge transport device according to claim 2, wherein said input contact means comprises a plurality of input contacts, each of said input contacts having at least one dimension corresponding to a numerical significance of a group of said N bits of digital information.

6. A digital-to-analog converter for an acoustic charge transport device according to claim 5, wherein said barrier means comprises a plurality of isolation regions positioned to electrically isolate said specified areas.

7. A digital-to-analog converter for an acoustic charge transport device having a channel region, comprising:
   means for receiving N bits of digital information;
   converting means for converting groups of said N bits of digital information to corresponding analog voltages;
   a plurality of input contact means, positioned adjacent to the channel region, for inducing charge packets in the channel region so that said charge packets have a charge corresponding to respective ones of said analog voltages; and
   a plurality of charge barriers positioned to separate said input contacts so that said charge packets are confined to specified areas of the channel region.

8. A digital-to-analog converter for an acoustic charge transport device according to claim 7, wherein said converting means includes:
   means for providing said corresponding analog voltages so that a correspondence between said groups of N bits of digital information and said corresponding analog voltages is non-linear.

9. A method of converting N bits of digital information for an acoustic charge transport device to an analog voltage comprising the steps of:
   (a) converting groups of the N bits of digital information to corresponding analog voltages;
   (b) generating charge packets in the acoustic charge transport device with charges corresponding to respective ones of the analog voltages; and
   (c) confining the charge packets to specified areas of the acoustic charge transport device.

10. A method of converting N bits of digital information according to claim 9, wherein step (a) includes the substep of:
    converting said groups of the N bits of digital information to corresponding analog voltages in accordance with a non-linear relationship.

11. A digital-to-analog converter for the input of an acoustic charge transport (ACT) device comprising a receiving means for receiving N digital inputs, a grouping means for combining said digital inputs into a predetermined number of groups, a demultiplexing means responsive to the state of said groups of digital inputs and operable to control a switching means for generating voltage outputs which correspond to said states of said groups of said digital inputs.

12. A device as in claim 11, further comprising an ACT packet means operable to generate charge packets corresponding to said voltage outputs, said ACT packet means comprising an input means wherein at least one dimension corresponds to the numerical significance of said corresponding group of digital inputs and a barrier means.

* * * * *